United States Patent
Yeh

(10) Patent No.: US 10,438,889 B2
(45) Date of Patent: Oct. 8, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: Chang-Lin Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/390,225

(22) Filed: Dec. 23, 2016

(65) Prior Publication Data

US 2018/0182704 A1 Jun. 28, 2018

(51) Int. Cl.
| | |
|---|---|
| *H01L 23/522* | (2006.01) |
| *H01L 23/532* | (2006.01) |
| *H01L 23/528* | (2006.01) |
| *H01L 23/52* | (2006.01) |
| *G06K 19/077* | (2006.01) |

(Continued)

(52) U.S. Cl.
CPC .... *H01L 23/5227* (2013.01); *G06K 19/07775* (2013.01); *H01L 23/528* (2013.01); *H01L 23/66* (2013.01); *H01L 25/0655* (2013.01); *H01L 23/49816* (2013.01); *H01L 23/5389* (2013.01); *H01L 2223/6677* (2013.01); *H01L 2924/15311* (2013.01); *H01L 2924/19107* (2013.01)

(58) Field of Classification Search
CPC ........... H01L 23/5227; H01L 23/53204; H01L 23/528; H01L 23/645; H01L 24/45; H01L 24/48; H01L 24/49; H01L 23/66; H01L 23/495; H01L 23/49838; H01L 2224/48091; H01L 2224/484; H01L 2224/73265; H01L 2224/49171; H01L 2224/45144; H01L 2924/12041; H01L 2924/16195; H01L 2221/68377; H01L 2223/6611; H01L 2223/6627; H01L 2223/6688; H01L 21/56; H01L 2924/19042; H01L 2924/30107; H01L 2924/1206; H01L 2223/6677; G06K 7/10336; G06K 7/10316; G06K 7/10356; G06K 7/10326; G06K 19/07783; G06K 19/0701; G06K 19/07777; G06K 19/0776
USPC ........ 257/414, 531; 336/170, 192, 200, 220
See application file for complete search history.

(56) References Cited

U.S. PATENT DOCUMENTS 5,966,063 A * 10/1999 Sato ................... H01F 17/04
336/200
8,294,546 B2 10/2012 Hatase
(Continued)

*Primary Examiner* — Natalia A Gondarenko
(74) *Attorney, Agent, or Firm* — Foley & Lardner LLP; Cliff Z. Liu

(57) ABSTRACT

The disclosure relates to an electronic module and a manufacturing method of the same. The electronic module includes a substrate, an electronic component, a first package body, a magnetic layer, a coil and a second package body. The electronic component is on the substrate. The first package body is on the substrate and covers the electronic component. The magnetic layer is on the first package body. The coil is on the magnetic layer. The coil includes a first section and a second section spaced from the first section. The first section and the second section are connected by a conductive material. The second package body is on the magnetic layer and covers the coil.

22 Claims, 14 Drawing Sheets

(51) Int. Cl.
*H01L 23/66* (2006.01)
*H01L 25/065* (2006.01)
*H01L 23/498* (2006.01)
*H01L 23/538* (2006.01)

(56) References Cited

U.S. PATENT DOCUMENTS

| | | | | |
|---|---|---|---|---|
| 2003/0024723 | A1* | 2/2003 | Igarashi | C08G 59/08 |
| | | | | 174/521 |
| 2006/0033664 | A1* | 2/2006 | Soler Castany | H01L 23/66 |
| | | | | 343/700 MS |
| 2008/0136574 | A1* | 6/2008 | Jow | H01F 17/0006 |
| | | | | 336/200 |
| 2011/0050191 | A1* | 3/2011 | Tsuji | H01F 17/0006 |
| | | | | 323/282 |
| 2012/0038025 | A1* | 2/2012 | Teggatz | H01L 21/4832 |
| | | | | 257/531 |
| 2012/0056297 | A1* | 3/2012 | Akhtar | H01L 23/5227 |
| | | | | 257/531 |
| 2014/0327356 | A1* | 11/2014 | Nakai | G06K 7/00 |
| | | | | 315/34 |
| 2015/0364248 | A1* | 12/2015 | Groves | H01F 41/04 |
| | | | | 336/232 |
| 2017/0025218 | A1* | 1/2017 | Sugiyama | H01F 27/2804 |

* cited by examiner

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly, to a semiconductor package device including a coil embedded therein and a method of manufacturing the same.

2. Description of the Related Art

Near-field communication (NFC) is a short-distance, high-frequency wireless communication technology and includes contact-free radio frequency identification (RFID) and interconnection technologies.

The NFC technology can be applied to products such as a credit card, an identification (ID) card, a smart phone or a wireless charger. It would be desirable to improve communication quality and to reduce a total package size of NFC devices.

SUMMARY

In accordance with some embodiments of the present disclosure, an electronic module includes a substrate, an electronic component, a first package body, a magnetic layer, a coil and a second package body. The electronic component is on the substrate. The first package body is on the substrate and covers the electronic component. The magnetic layer is on the first package body. The coil is on the magnetic layer. The coil includes a first section and a second section spaced from the first section. The first section and the second section are connected by a conductive material. The second package body is disposed on the magnetic layer and covers the coil.

In accordance with some embodiments of the present disclosure, an electronic module includes a substrate, an electronic component, a first package body, a magnetic layer, a plurality of pillars and a conductive wire. The electronic component is on the substrate. The first package body is on the substrate and covers the electronic component. The magnetic layer is on the first package body. The plurality of pillars are on the magnetic layer and are spaced from one another. The conductive wire connects each of the plurality of pillars.

In accordance with some embodiments of the present disclosure, an electronic module includes a substrate, an electronic component, a first package body, a magnetic layer, a plurality of conductive contacts and a plurality of conductive wires. The electronic component is on the substrate. The first package body is on the substrate and covers the electronic component. The magnetic layer is on the first package body. The plurality of conductive contacts are on the magnetic layer and are spaced from one another. Each of the plurality of conductive wires is connected between two conductive contacts.

Figure 1A:
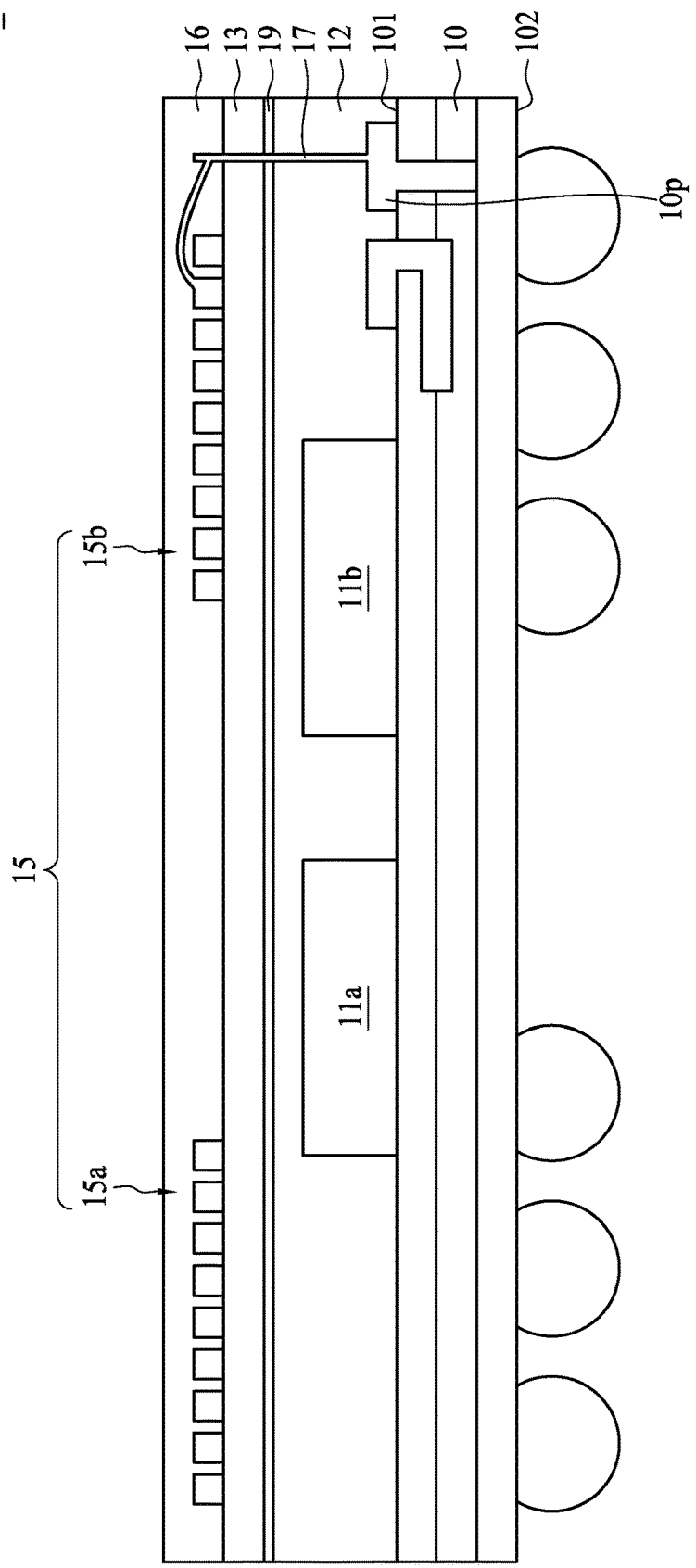
FIG. 1A illustrates a cross-sectional view of a semiconductor package device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

In some embodiments of this disclosure, namely embodiments in which radio frequency identification (RFID) is used for near-field communication (NFC), an antenna structure is used for passive RFID, semi-passive RFID, or active RFID, each of which may benefit from improvements in communication quality and increased communication distance. Of these forms of RFID, in addition to challenges related to transmission through the antenna structure, passive RFID faces an additional challenge in that power to operate logic in a passive RFID device is received by way of an induced current from an associated antenna structure, and the received power should be sufficient to power the logic in the RFID device. Thus, in passive RFID devices, the antenna structure may be used both to receive a power transfer (the induced current) and to transmit information. Current may be induced in the antenna structure by passing the antenna through a magnetic field, such as a magnetic field generated by an RFID reader. The magnetic field is strongest closest to the source, and diminishes as a distance from the source increases. An improvement in the reception capability of the antenna structure may allow for an RFID device to receive sufficient power to operate the logic of the RFID device at an increased distance from a magnetic field source. Additionally, an improvement in the reception capability of the antenna may also improve the transmission capability of the antenna. Because of the additional challenges faced by passive RFID, this disclosure describes an antenna structure useful for improving a passive RFID device. However, an antenna structure according to some embodiments will also be useful for improving other NFC devices and non-NFC devices FIG. 1A illustrates a cross-sectional view of a semiconductor package device 1 in accordance with some embodiments of the present disclosure. The semiconductor package device 1 includes a substrate 10, conductive pads 18, electronic components 11a, 11b, package bodies 12, 16, a magnetically permeable layer (or magnetic layer) 13, a coil 15 and an electrical connection 17.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the grounding element is a via exposed from a lateral surface of the substrate 10. In some embodiments, the grounding element is a metal layer exposed from the lateral surface of the substrate 10. In some embodiments, the grounding element is a metal trace exposed from the lateral surface of the substrate 10. The substrate 10 may include opposite surfaces 101 and 102. In some embodiments, the surface 101 of the substrate 10 is referred to as a top surface or a first surface and the surface 102 of the substrate 10 is referred to as a bottom surface or a second surface.

The electronic components 11a, 11b are disposed on the surface 101 of the substrate 10. The electronic component 11a may be a passive electronic component, such as a capacitor, a resistor or an inductor. The electronic component 11b may be an active electronic component, such as an integrated circuit (IC) chip or a die. Each electronic component 11a, 11b may be electrically connected to one or more other electronic components and to the substrate 10 (e.g., to the RDL), and electrical connection may be attained by way of flip-chip or wire-bond techniques.

The package body (e.g., a first package body) 12 is disposed on the surface 101 of the substrate 10 and encapsulates the electronic components 11a, 11b. In some embodiments, the package body 12 includes an epoxy resin having fillers dispersed therein.

The magnetically permeable layer 13 is disposed on the package body 12. In some embodiments, the magnetically permeable layer 13 is attached to the package body 12 through an adhesive layer 19. In some embodiments, the magnetically permeable layer 13 may include a magnetic layer and a conductive layer which is electrically connected to a grounding pad on the surface 101 of the substrate 10. The magnetically permeable layer 13 is, or includes, a material with high permeability and low magnetic saturation. The magnetically permeable layer 13 can be, or can include, for example, molybdenum (Mo), nickel (Ni), cobalt (Co), iron (Fe), iron-cobalt alloy (FeCo), iron-nickel alloy (FeNi), nickel-vanadium alloy (NiV), ferric oxide ($Fe_2O_3$), iron-manganese-zinc-oxide (Fe—Mn—Zn—O) or iron-nickel-zinc-oxide Fe—Ni—Zn—O or an alloy thereof, another magnetically permeable metal or metal alloy (e.g., another nickel-containing or iron-containing material), or a combination thereof. One measure of magnetic permeability of a material is in terms of its relative permeability with respect to a permeability of free space. Examples of suitable magnetically permeable materials for the magnetically permeable layer 13 include those having a relative permeability greater than about 1, such as at least about 2, at least about 5, at least about 10, at least about 50, at least about 100, at least about 500, at least about 1000, at least about 5000, at least about $10^4$, at least about $10^5$, or at least about $10^6$.

Magnetic permeability of a material can be measured at room temperature and at a particular field strength, such as about 0.5 Tesla or about 0.002 Tesla. In some embodiments, the permeability of the magnetically permeable layer 13 is in a range from about 500 henries per meter (H/m) to about 3000 H/m.

The coil 15 is disposed on the magnetically permeable layer 13. The coil 15 is, or includes, a conductive material such as a metal or metal alloy. Examples of the conductive material include gold (Au), silver (Ag), aluminum (Al), copper (Cu), or an alloy thereof. The coil 15 can be magnetically coupled to a magnetic field to induce a current within the coil 15. Thus, the coil 15 performs a function of a wireless receiver (e.g., a charging coil). In some embodiments, a thickness of the coil 15 is at least about 10 micrometers (μm). In some embodiments, the coil 15 includes a first section 15a of the coil 15 and a second section 15b of the coil 15.

The package body (e.g., a second package body) 16 is disposed on the magnetically permeable layer 13 and encapsulates the coil 15. In some embodiments, the package body 16 includes an epoxy resin having fillers dispersed therein. In some embodiments, a filler of the second package body 16 is smaller than a filler of the first package body 12.

The electrical connection 17 penetrates the package body 16, the magnetically permeable layer 13 and the package body 12 to electrically connect the coil 15 with a conductive pad 10p on the surface 101 of the substrate 10. In some embodiments, the induced current is provided to the electronic components 11a, 11b through the electrical connection 17 and the interconnection structure (e.g., the RDL) within the substrate 10, so as to power the electronic components 11a, 11b or other electronic components external to the semiconductor package device 1.

The conductive pads 18 are disposed on the surface 102 of the substrate 10. The conductive pads 18 are used to provide electrical connections between the semiconductor package device 1 and external circuits. For example, the conductive pads 18 can be attached to a circuit board to be electrically connected with other electronic components on the circuit board.

Figure 1B:
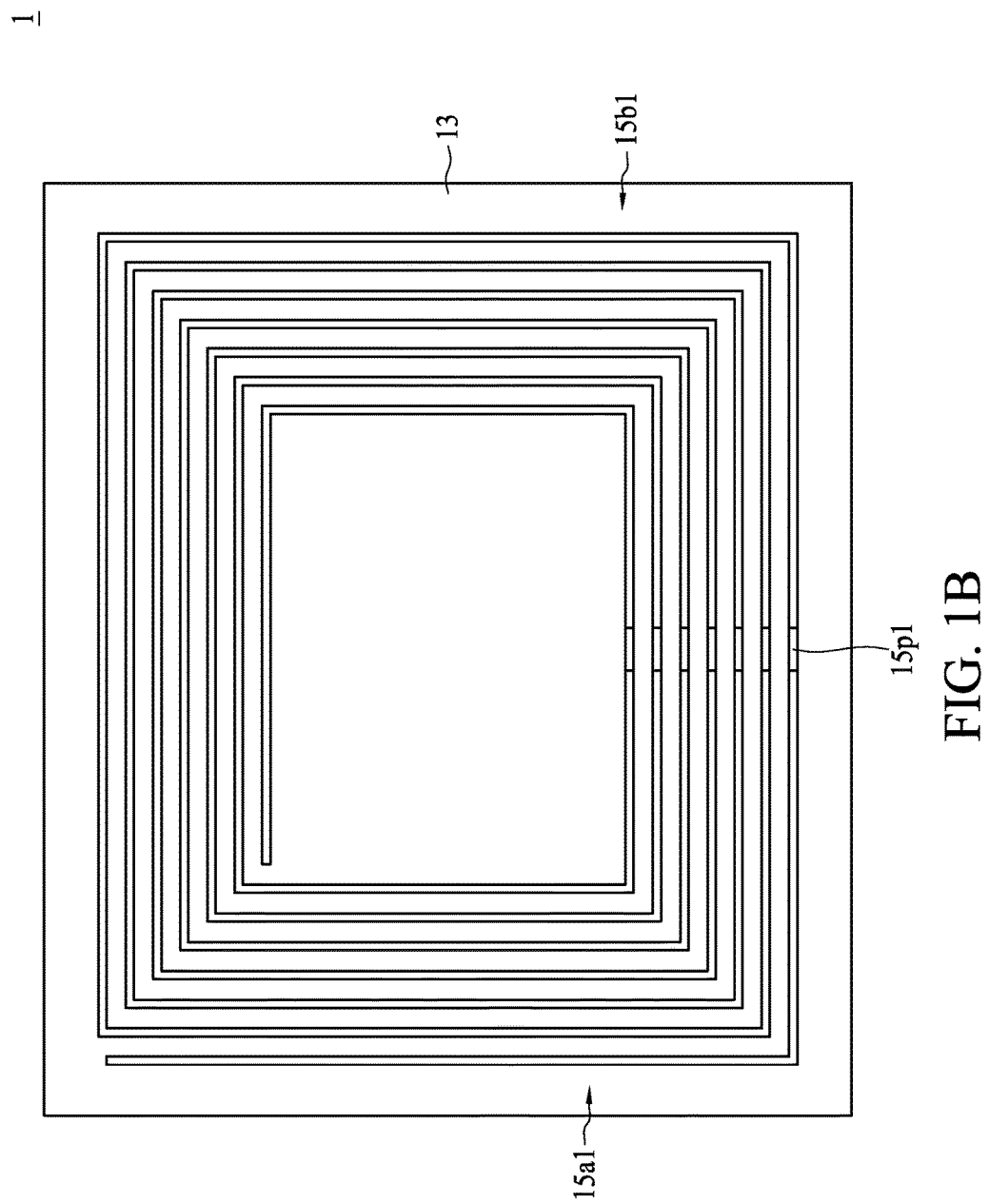
FIG. 1B illustrates a top view of a semiconductor package device in accordance with some embodiments of the present disclosure.

FIG. 1B illustrates a top view of the semiconductor package device 1 in accordance with some embodiments of the present disclosure.

As shown in FIG. 1B, the coil 15 can be divided into two sections or parts 15a1, 15b1, which can be referred to as a first section or a first part 15a1 of the coil 15 and a second section or a second part 15b1 of the coil 15. One terminal or a first terminal of each segment of the section 15a1 is connected to a corresponding segment of the section 15b1, while another or second terminal of each segment of the section 15a1 is separated or spaced from a corresponding segment of the section 15b1. The separated terminal of each segment of the section 15a1 is electrically connected to a corresponding terminal of a segment of the section 15b1 through a conductive material 15p1 to form the coil 15. In some embodiments, the conductive material 15p1 is a same material as that of the coil 15. Alternatively, the conductive material 15p1 and the coil 15 are formed from different materials. As shown in FIG. 1B, a separation is formed at a middle portion of the coil 15. In other embodiments, the separation can be formed at any section of the coil (such as at a corner of the coil 15) depending on specifications for designing circuits.

Figure 1C:
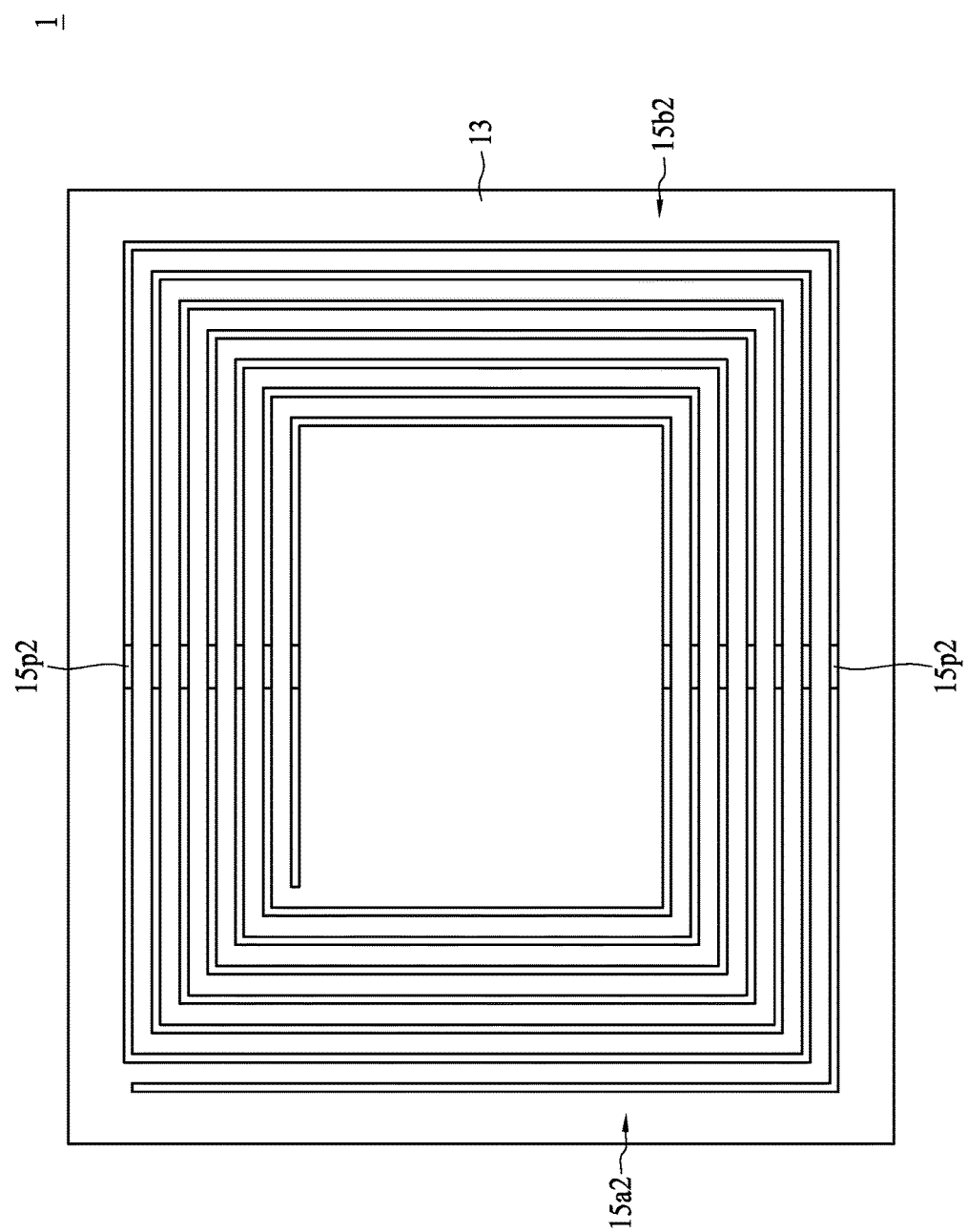
FIG. 1C illustrates a top view of a semiconductor package device in accordance with some embodiments of the present disclosure.

FIG. 1C illustrates a top view of the semiconductor package device 1 in accordance with some embodiments of the present disclosure.

As shown in FIG. 1C, the coil 15 can be divided into two sections or parts 15a2, 15b2, which can be referred to as a first section or a first part 15a2 of the coil 15 and a second section or a second part 15b2 of the coil 15. Two terminals of each segment of the section 15a2 are separated from corresponding segments of the section 15b2. At both separated terminals of each segment, the section 15a2 is electrically connected to a corresponding segment of the section 15b2 through a conductive material 15p2 to form the coil 15. In some embodiments, the conductive material 15p2 is made from a same material as that of the coil 15. Alternatively, the conductive material 15p2 and the coil 15 are formed from different materials. As shown in FIG. 1C, a separation is formed at a middle portion of the coil 15. In other embodiments, the separation can be formed at any portion of the coil (such as at a corner of the coil 15) depending on specifications for designing circuits.

Figure 1D:
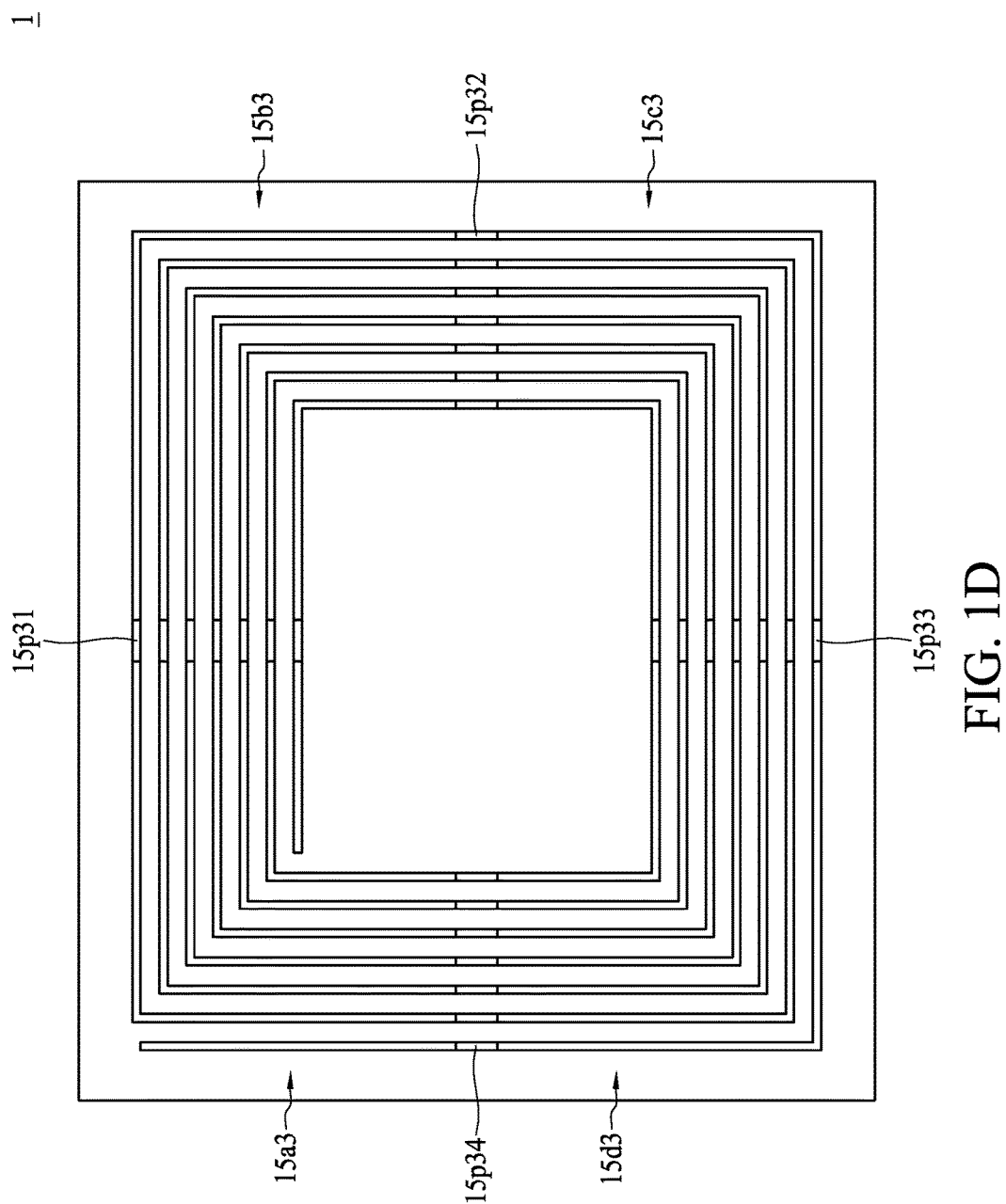
FIG. 1D illustrates a top view of a semiconductor package device in accordance with some embodiments of the present disclosure.

FIG. 1D illustrates a top view of the semiconductor package device 1 in accordance with some embodiments of the present disclosure.

As shown in FIG. 1D, the coil 15 can be divided into four sections or parts 15a3, 15b3, 15c3 and 15d3. The section 15a3 is electrically connected to the section 15b3 through a conductive material 15p31. The section 15b3 is electrically connected to the section 15c3 through a conductive material 15p32. The section 15c3 is electrically connected to the portion 15d3 through a conductive material 15p33. The portion 15d3 is electrically connected to the portion 15a3 through a conductive material 15p34. In some embodiments, the conductive materials 15p31, 15p32, 15p33 and 15p34 are a same material as that of the coil 15. Alternatively, the conductive materials 15p31, 15p32, 15p33 and 15p34 and the coil 15 are formed from different materials. As shown in FIG. 1D, a separation is formed at a middle portion of the coil 15. In other embodiments, the separation can be formed at any portion of the coil (such as at a corner of the coil 15) depending on specifications for designing circuits. As shown in FIG. 1D, the coil 15 includes a single spiral inductor coil that includes a plurality of turns. Each turn of the plurality of turns includes at least one portion including at least one conductive material (e.g., the conductive material 15p31, 15p32, 15p33, or 15p34). The conductive material of a first turn of the plurality of turns is co-aligned with the conductive material of a second turn of the plurality of turns that is adjacent to the first turn.

To reduce a total size or area of a chip, a coil and other electronic components may be integrated into a single package. In some other approaches, a pitch of the coil is scaled down to miniaturize an inductor coil while keeping or improving performance. However, a stencil to make such a fine-pitched coil may not support a weight of the coil and may lead to deformation, which may cause various problems (e.g., turns of the coil may be shorted due to the deformation). In accordance with some embodiments (e.g., as shown in FIGS. 1B-1D), the coil 15 is divided into at least two sections and the separated sections are connected through a conductive material. Therefore, each segment of the separated portions of the coil 15 is much shorter than a total length of the coil without separation, so as to avoid deformation of the coil 15.

Figure 2A:
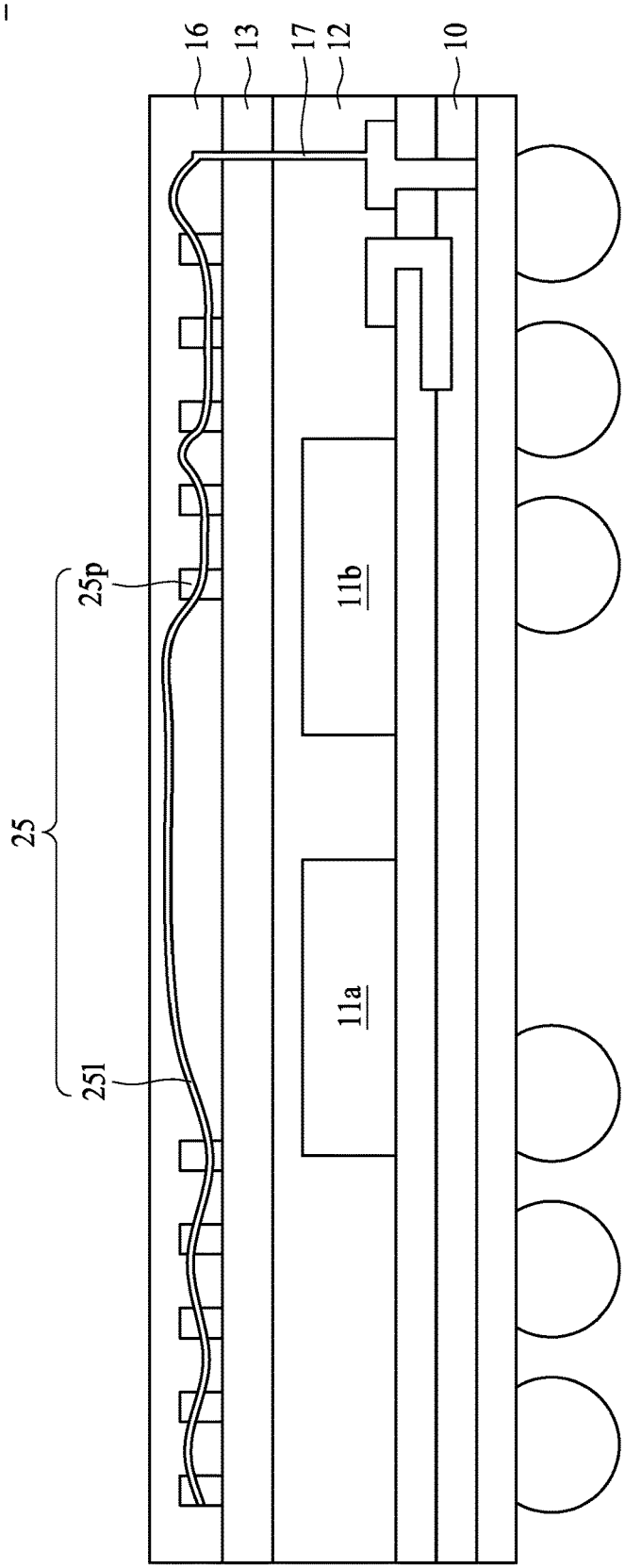
FIG. 2A illustrates a cross-sectional view of a semiconductor package device in accordance with some embodiments of the present disclosure.

FIG. 2A illustrates a cross-sectional view of a semiconductor package device 2 in accordance with some embodiments of the present disclosure. The semiconductor package device 2 is similar to the semiconductor package device 1 shown in FIG. 1A except that a coil 25 of the semiconductor package device 2 is different from the coil 15 of the semiconductor package device 1.

As shown in FIG. 2A, a plurality of pillars 25p are disposed on the magnetically permeable layer 13. In some embodiments, the pillars 25p are made of non-conductive material, such as non-conductive adhesive or epoxy resin.

A conductive wire 251 is disposed over the magnetically permeable layer 13 and connects one pillar to another pillar to form the coil 25.

Figure 2B:
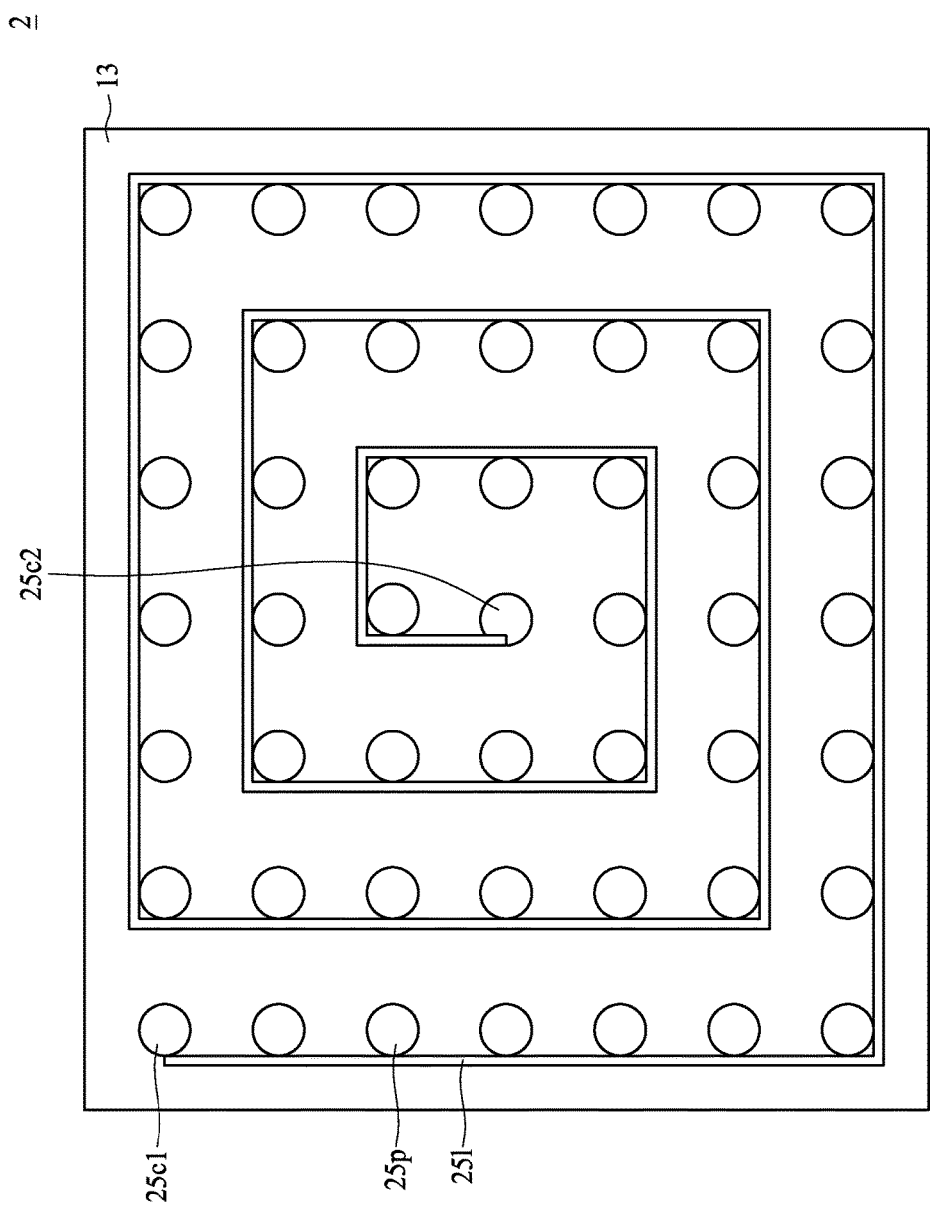
FIG. 2B illustrates a top view of a semiconductor package device in accordance with some embodiments of the present disclosure.

FIG. 2B illustrates a top view of the semiconductor package device 2 in accordance with some embodiments of the present disclosure.

As shown in FIG. 2B, the pillars 25p are separated from each other and are arranged in a matrix structure. In other embodiments, the pillars 25p can be arranged in a circle or other shapes depending on specifications for designing circuits. The conductive wire 251 winds around the pillars 25p and connects one pillar to another pillar to form the coil 25. The conductive wire 251 contacts any one of the pillars once.

Conductive pads 25c1 and 25c2 are disposed on the magnetically permeable layer 13. The conductive pads 25c1 and 25c2 are disposed at both terminals of the coil 25 to provide an electrical connection between the coil 25 and other electronic components.

Figure 2C:
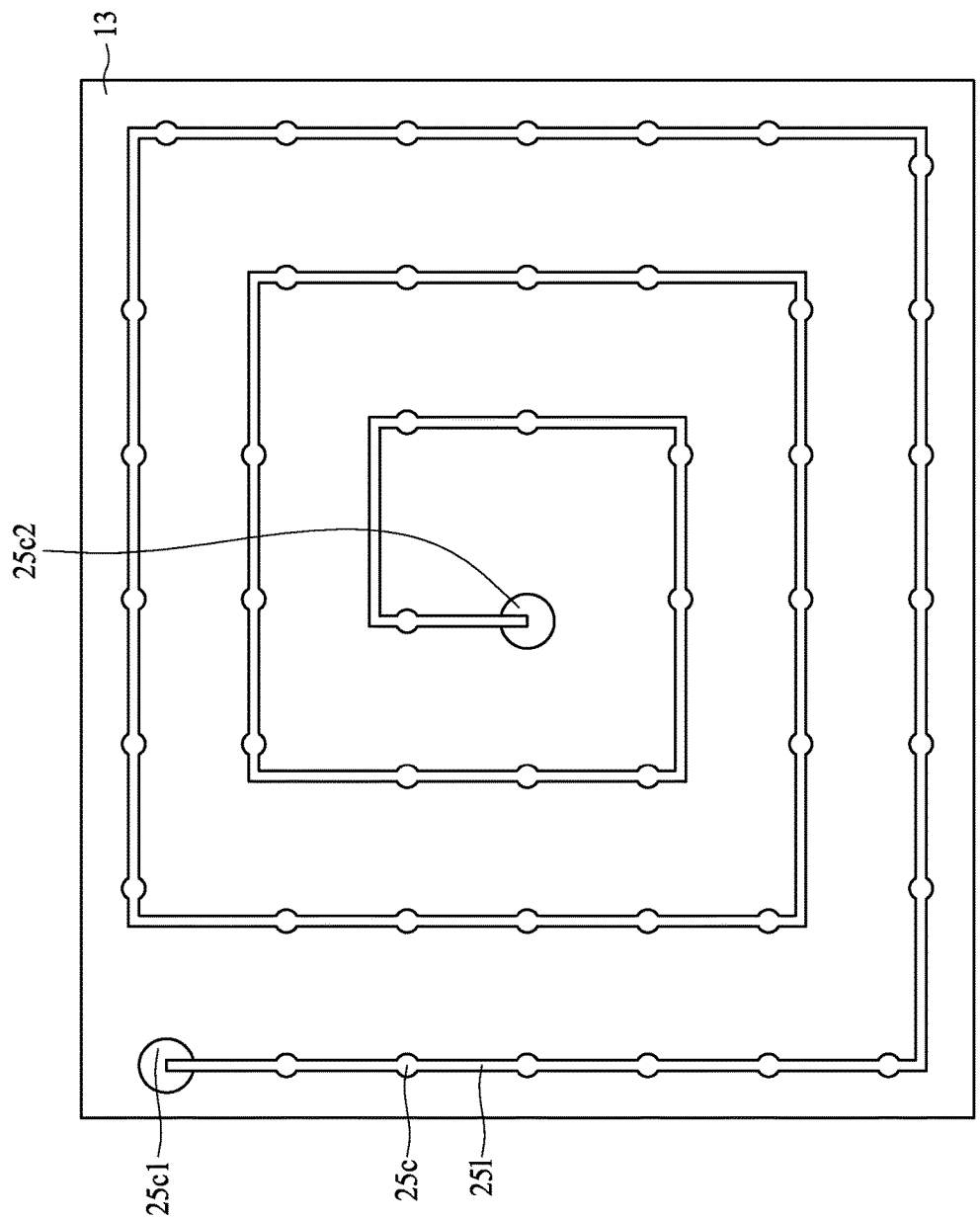
FIG. 2C illustrates a top view of a semiconductor package device in accordance with some embodiments of the present disclosure.

FIG. 2C illustrates a top view of the semiconductor package device 2 in accordance with some embodiments of the present disclosure. The top view of the semiconductor package device 2 shown in FIG. 2C is similar to that shown in FIG. 2B, except that in FIG. 2C, the pillars 25p are replaced by a plurality of conductive contacts 25c.

As shown in FIG. 2C, the conductive contacts 25c are separated from each other and are arranged in a matrix structure. In other embodiments, the conductive contacts 25c can be arranged in a circle or other shapes depending on specifications for designing circuits. The conductive wire 251 winds around the conductive contacts 25c and connects one conductive contact to another conductive contact to form the coil 25. The conductive wire 251 contacts any one of the conductive contacts once. Each conductive contact 25c contacts no more than two segments of the conductive wire 251 (e.g., each conductive contact 25c contacts one segment or two segments).

In some other wireless devices, a coil may be built using electroplating. However, the use of electroplating may increase manufacturing cost. In addition, a thickness of the coil may be limited by electroplating time, which might lead to uneven thickness of the coil. As shown in FIGS. 2B and 2C, the coil 25 is formed by using a conductive wire 251 to wind around the pillars 25p or the conductive contacts 25c, which may reduce manufacturing cost. In addition, since the thickness of the coil 25 can be easily determined by selecting the thickness of the conductive wire 251, a trace number of the coil 25 can be increased. Therefore, the coil 25 shown in FIGS. 2B and 2C may have smaller resistance and higher Q factor, which may in turn increase a charging efficiency of the coil 25.

Figure 3:
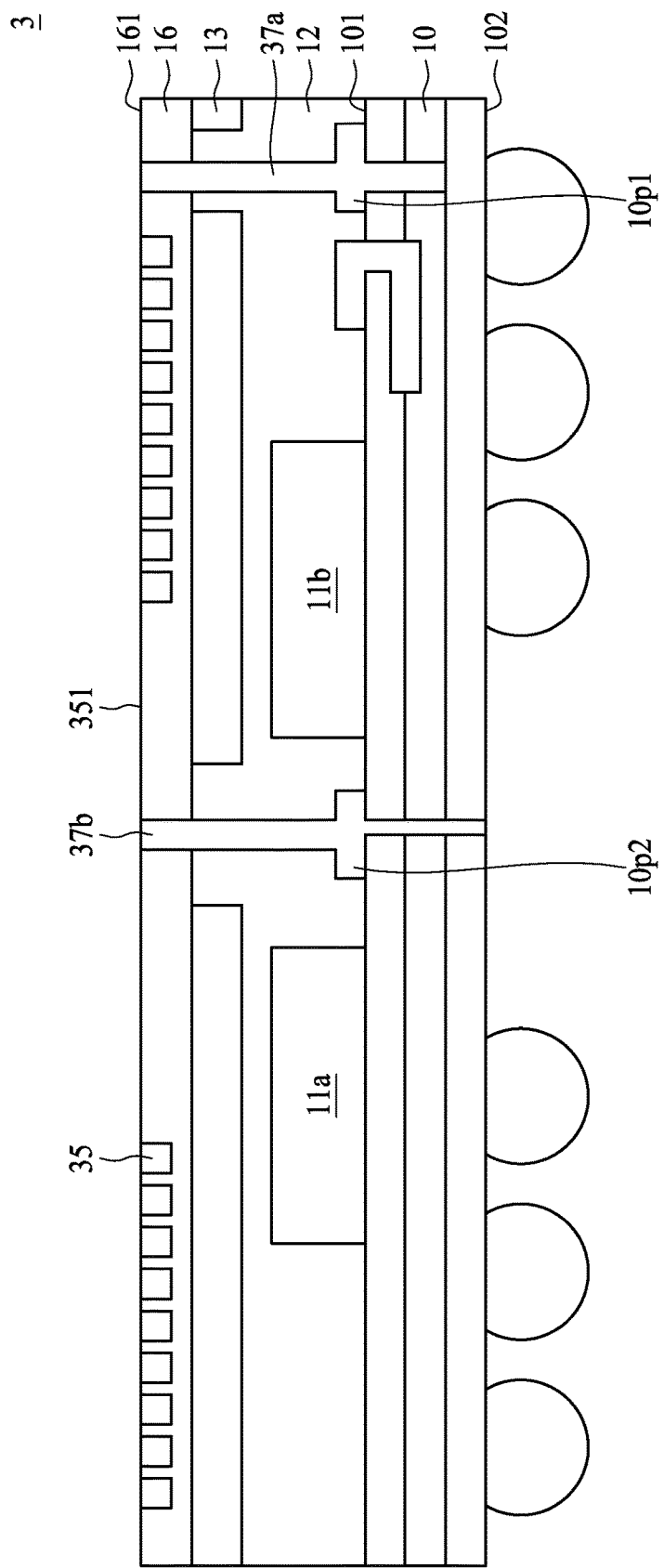
FIG. 3 illustrates a cross-sectional view of a semiconductor package device in accordance with some embodiments of the present disclosure.

FIG. 3 illustrates a cross-sectional view of a semiconductor package device 3 in accordance with some embodiments of the present disclosure. The semiconductor package device 3 is similar to the semiconductor package device 1 shown in FIG. 1A except that a coil 35 of the semiconductor package device 3 is different from the coil 15 of the semiconductor package device 1 and that the semiconductor package device 3 includes two electrical connections 37a, 37b.

The coil 35 is disposed over the magnetically permeable layer 13. A surface 351 of the coil 35 is substantially coplanar with a surface 161 of the package body 16. In other words, the surface 351 of the coil 35 is exposed from the package body 16.

The electrical connection 37a penetrates the package body 16, the magnetically permeable layer 13 and the package body 12 to contact the conductive pad 10p1 of the substrate 10. The electrical connection 37b penetrates the package body 16, the magnetically permeable layer 13 and the package body 12 to contact a conductive pad 10p2 of the substrate 10. The electrical connection 37a is electrically connected to one terminal (e.g., a first terminal) of the coil 35 while the electrical connection 37b is electrically connected with another terminal (e.g., a second terminal) of the coil 35. The electrical connections 37a and 37b are used to electrically connect the coil 35 with the conductive pads 10p1 and 10p2, respectively, so that induced current generated by the coil 35 can be provided to the electronic components 11a, 11b through the electrical connections 37a, 37b and the interconnection structure (e.g., the RDL) within the substrate 10. In some embodiments, the electrical connections 37a and 37b can be applied to the semiconductor package device 1 or 2 shown in FIG. 1A or FIG. 2A. Similarly, the coil 35 shown in FIG. 3 can be replaced by any of the coils shown in FIGS. 1A-1D, 2B and 2C, depending on specifications for designing circuits.

In some other wireless devices, electrical connections are located at an edge of a package. Therefore, a terminal at a center of a coil may be connected to the electrical connections through a long wire, which may cause a short circuit. By connecting the terminal at the center of the coil 35 to the substrate 10 through the adjacent electrical connection 37b, as shown in FIG. 3, a short circuit can be avoided.

Figure 4:
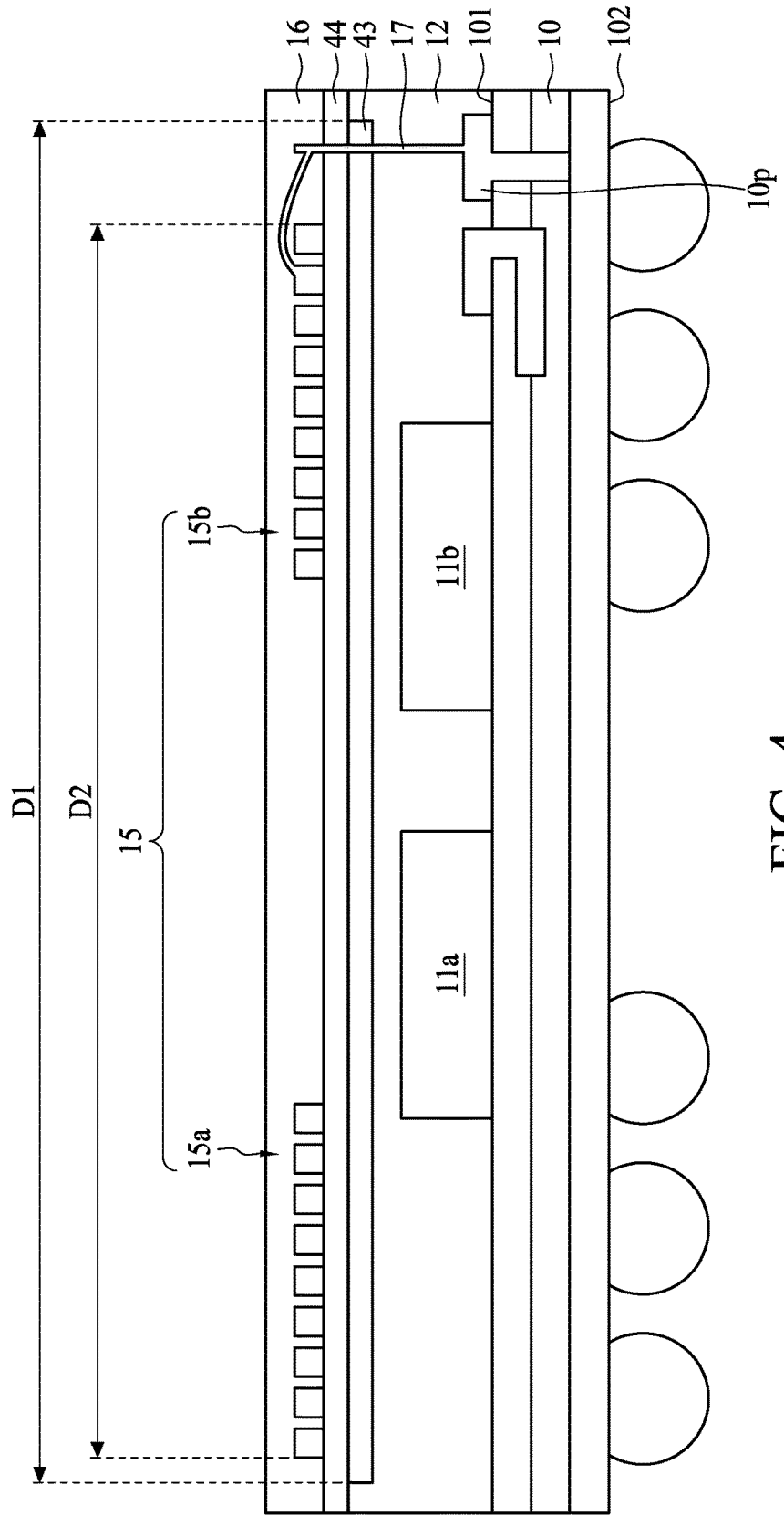
FIG. 4 illustrates a cross-sectional view of a semiconductor package device in accordance with some embodiments of the present disclosure.

FIG. 4 illustrates a cross-sectional view of a semiconductor package device 4 in accordance with some embodiments of the present disclosure. The semiconductor package device 4 is similar to the semiconductor package device 1 shown in FIG. 1A except that the semiconductor package device 4 further includes an insulating layer 44 and that a magnetically permeable layer 43 is completely encapsulated by the package body 12.

The insulating layer 44 is disposed over the package body 12. In some embodiments, the insulating layer 44 and the package bodies 12 and 16 include a same material. Alternatively, the insulting layer 44 and the package bodies 12 and 16 are formed of different materials. The insulating layer 44 can be used to prevent a short circuit between the magnetically permeable layer 43 and the coil 15.

The magnetically permeable layer 43 is disposed within the package body 12. Accordingly, a lateral or side surface of the magnetically permeable layer 43 is not exposed from a lateral or side surface of the package body 12. An area of the magnetically permeable layer 43 is less than that of the insulating layer 44. In some embodiments, the area of the magnetically permeable layer 43 is substantially at least 95% of the area of the insulating layer 44. Encapsulating the magnetically permeable layer 43 within the package body 12 may prevent the magnetically permeable layer 43 from oxidization.

In some embodiments, a width of the magnetically permeable layer 43 is greater than a diameter D2 of the coil 15. Therefore, the magnetically permeable layer 43 can prevent the electronic components 11a, 11b on the surface 101 of the substrate 10 from being interfered with by undesired magnetic fields passing through the coil 15. The coil 15 shown in FIG. 4 can be replaced by any of the coils shown in FIGS. 1A-1D, 2B, 2C and 3, depending on specifications for designing circuits.

Figure 5A:
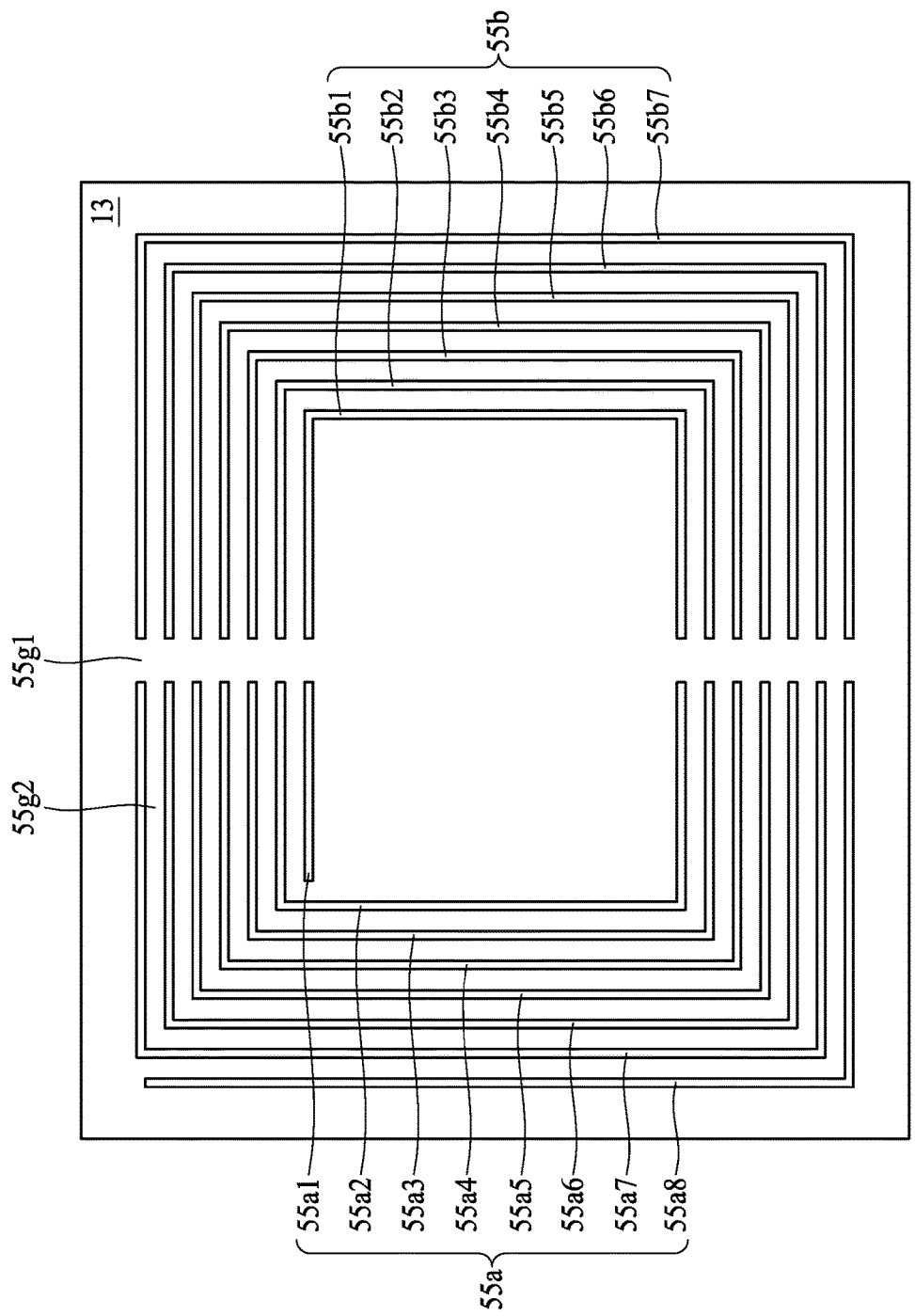
FIG. 5A and FIG. 5B illustrate a semiconductor manufacturing method in accordance with some embodiments of the present disclosure.
Figure 5B:
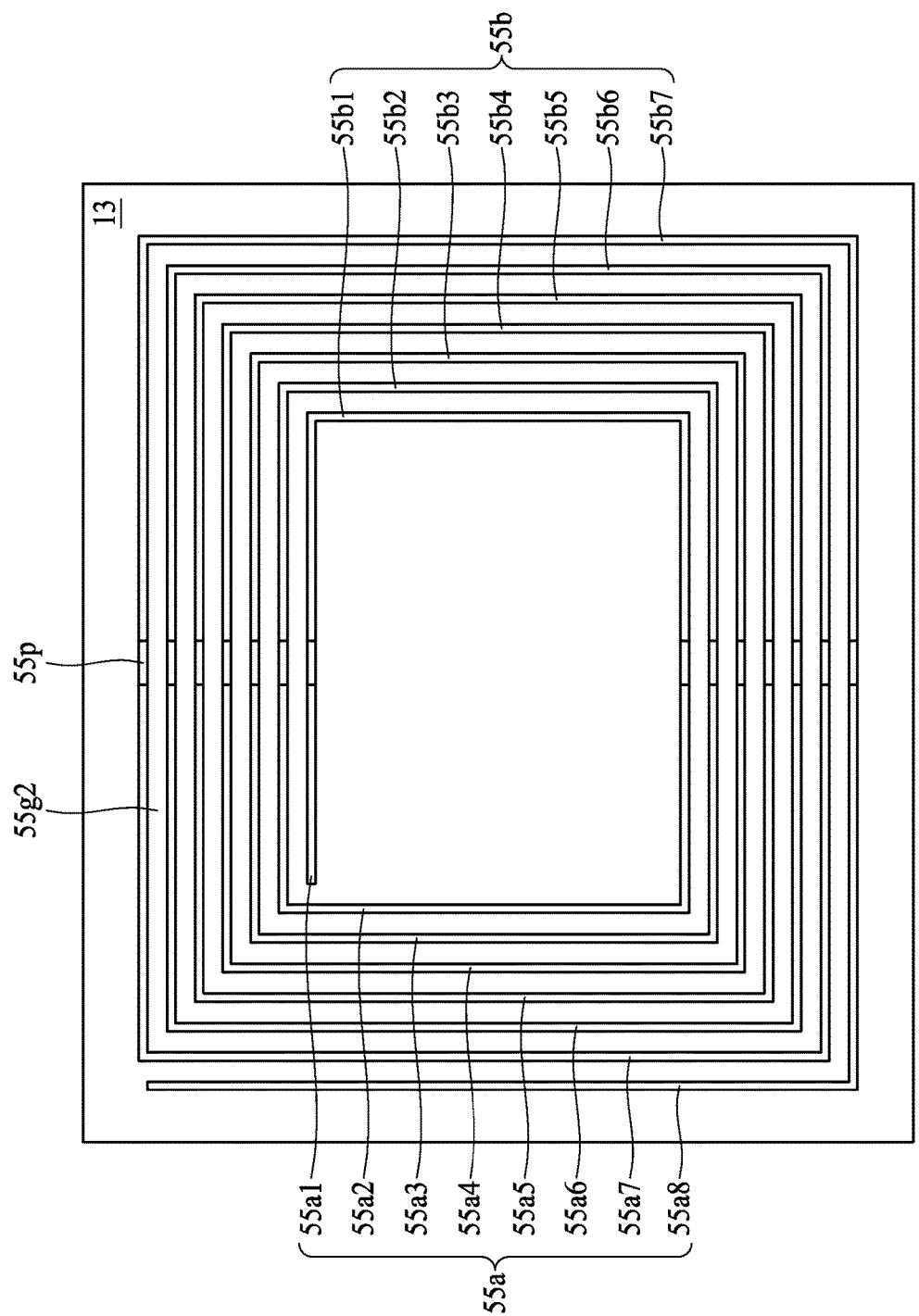

FIGS. 5A-5B illustrate a semiconductor manufacturing method in accordance with some embodiments of the present disclosure.

Referring to FIG. 5A, a first section of conductive lines 55a and a second section of conductive lines 55b are disposed on the magnetically permeable layer 13. The first section of conductive lines 55a includes segments 55a1, 55a2, 55a3, 55a4, 55a5, 55a6, 55a7 and 55a8, and the segments 55a1, 55a2, 55a3, 55a4, 55a5, 55a6, 55a7 and 55a8 are separated from each other by respective gaps 55g2. The second section of conductive lines 55b includes segments 55b1, 55b2, 55b3, 55b4, 55b5, 55b6, 55b7 and 55b8, and the segments 55b1, 55b2, 55b3, 55b4, 55b5, 55b6, 55b7 and 55b8 are separated from each other by the respective gaps 55g2. The first section of conductive lines 55a and the second section of conductive lines 55b are separated by a plurality of gaps 55g1. For example, the segment 55a1 of the first section of conductive lines 55a is separated from the segment 55b1 of the second section of conductive lines 55b by the gap 55g1. In some embodiments, the sections of conductive lines 55a and 55b can be formed by printing a conductive material on the magnetically permeable layer 13.

Referring to FIG. 5B, the gaps 55g1 are filled by a conductive material 55p (e.g., a conductive adhesive) to electrically connect each segment of the first section of the conductive lines 55a with a corresponding segment of the second section of the conductive lines 55b. For example, the segment 55a1 is electrically connected to the segment 55b1, the segment 55a2 is electrically connected to the segments 55b1 and 55b2, the segment 55a3 is electrically connected to the segments 55b2 and 55b3, and so on. In some embodiments, the conductive material 55p is the same as a material of the sections of the conductive lines 55a and 55b. Alternatively, the conductive material 55p and the sections of the conductive lines 55a and 55b are formed from different materials.

The gaps 55g2 are then filled by a non-conductive material to form the coil as shown in FIG. 1C. The non-conductive material can include, for example, a molding compound. In some embodiments, the non-conductive material and the package body 12 are formed from the same material. Alternatively, the non-conductive material and the package body 12 are formed from different materials. That is, a filler of the non-conductive material is smaller than that of the package body 12. In some embodiments, after filling the gaps 55g2, the package body 16 is formed to cover the coil, and the semiconductor package device 1 as shown in FIG. 1A is formed.

Figure 6A:
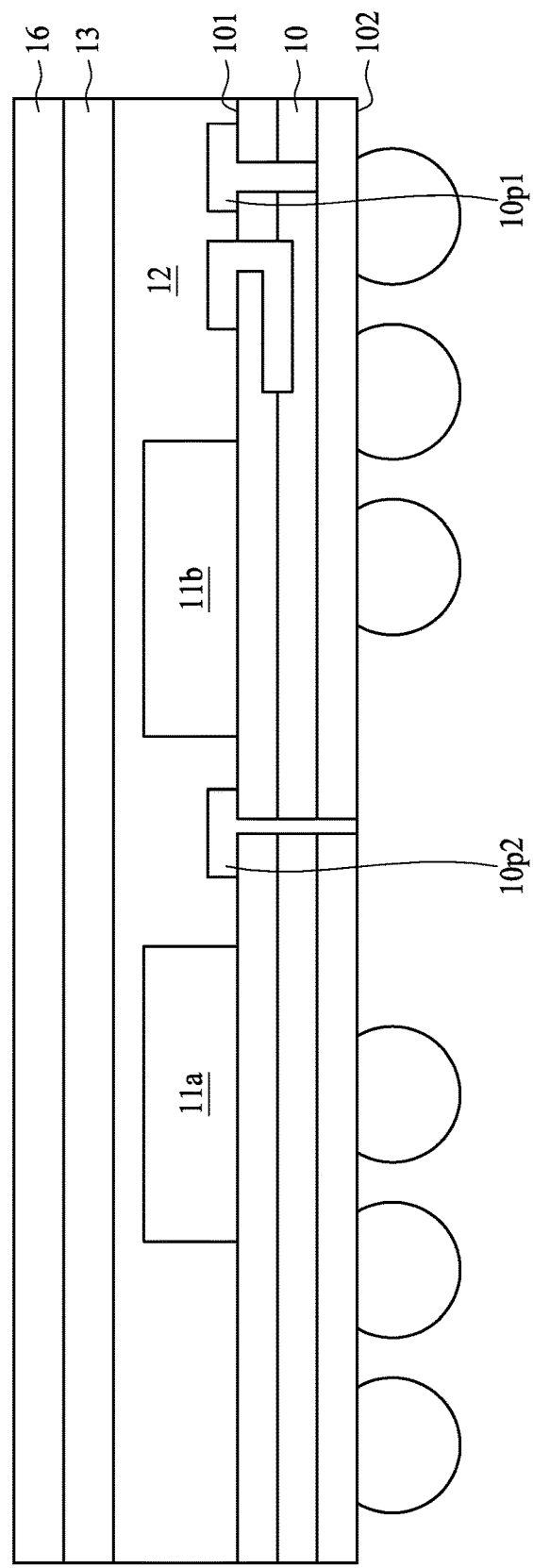
FIG. 6A, FIG. 6B and FIG. 6C illustrate a semiconductor manufacturing method in accordance with some embodiments of the present disclosure.
Figure 6B:
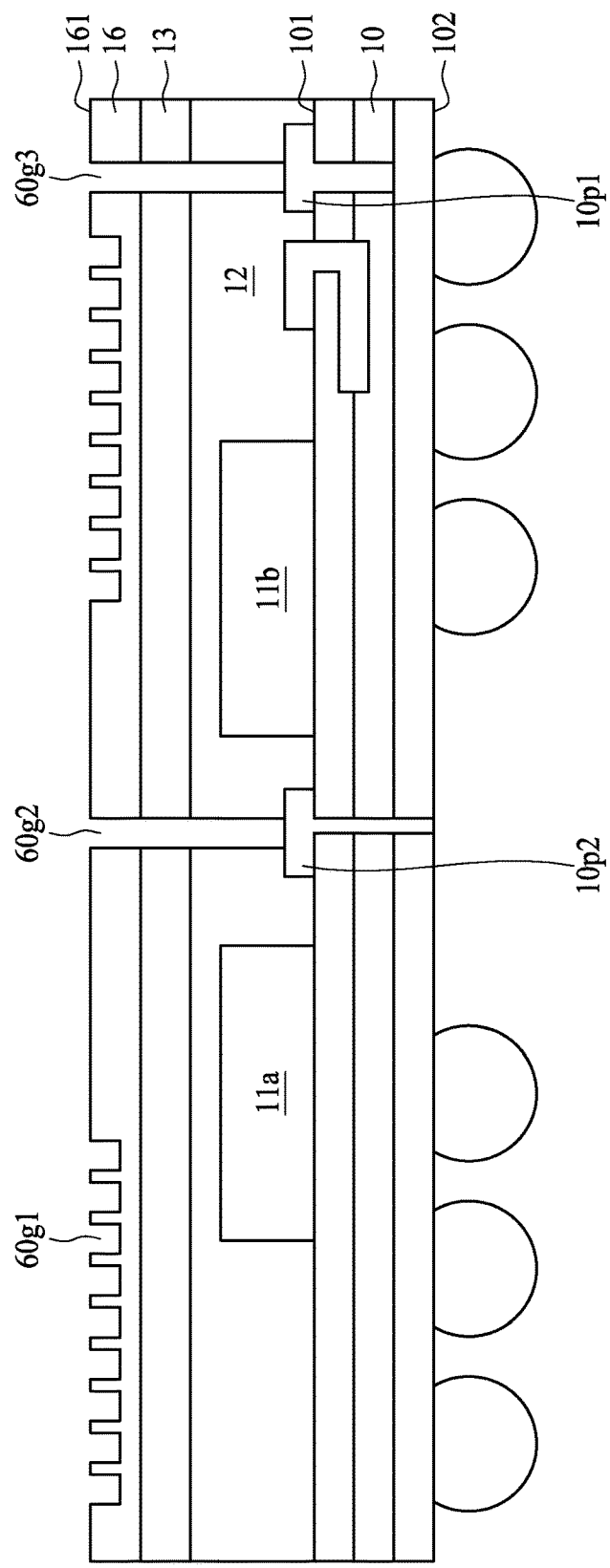
Figure 6C:
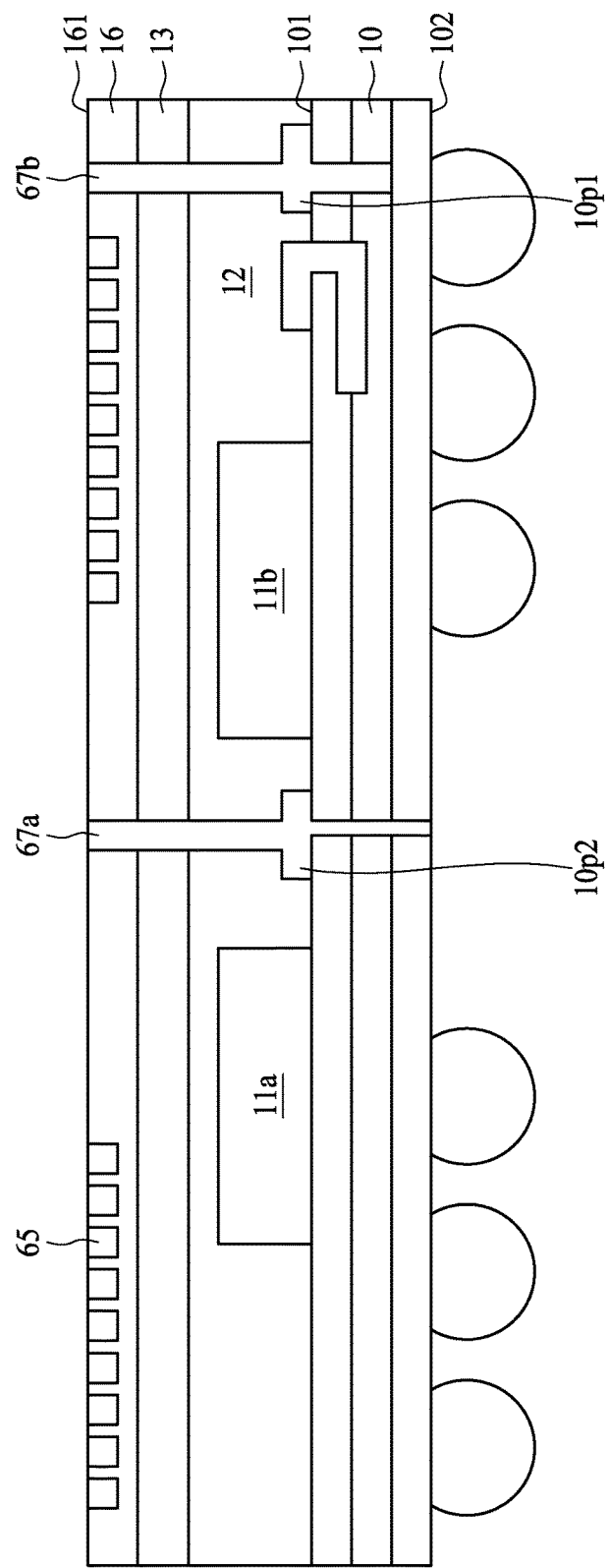

FIGS. 6A-6C illustrate a semiconductor manufacturing method in accordance with some embodiments of the present disclosure.

Referring to FIG. 6A, a substrate 10 is provided. The substrate 10 includes conductive pads 10p1 and 10p2 on its surface 101. The substrate 10 may include an interconnection structure, such as an RDL or a grounding element. In some embodiments, the grounding element is a via exposed from a lateral or side surface of the substrate 10. In some embodiments, the grounding element is a metal layer exposed from the lateral surface of the substrate 10.

Electronic components 11a, 11b are disposed on the surface 101 of the substrate 10. The electronic component 11a may be a passive electronic component, such as a capacitor, a resistor or an inductor. The electronic component 11b may be an active electronic component, such as an IC chip or a die. The electronic component 11a, 11b may be connected to the substrate 10 by flip-chip or wire-bond techniques.

The package body 12 is formed on the surface 101 of the substrate 10 and encapsulates the electronic components 11a, 11b. In some embodiments, the package body 12 includes an epoxy resin having fillers dispersed therein.

A magnetically permeable layer 13 is formed on the package body 12. In some embodiments, the magnetically permeable layer 13 is attached to the package body 12 through an adhesive layer 19. In some embodiments, the magnetically permeable layer 13 may include a magnetic layer and a conductive layer which is electrically connected to a grounding pad on the surface 101 of the substrate 10.

The package body 16 is formed on the magnetically permeable layer 13. In some embodiments, the package body 16 includes an epoxy resin having fillers dispersed therein.

Referring to FIG. 6B, a plurality of cavities 60g1 are formed from the surface 161 of the package body 16 into the package body 16 without completely penetrating the package body 16. A through hole 60g2 is formed to penetrate the package body 16, the magnetically permeable layer 13 and the package body 12 to expose the conductive pad 10p2 of the substrate 10. A through hole 60g3 is formed to penetrate the package body 16, the magnetically permeable layer 13 and the package body 12 to expose the conductive pad 10p1 of the substrate 10. The cavities 60g1 and the through holes 60g2 and 60g3 can be formed by, for example, laser drilling, etching or other suitable processes.

Referring to FIG. 6C, the cavities 60g1 are filled with a conductive material to form a coil 65. The through hole 60g2 is filled with a conductive material to form an electrical connection 67a and the through hole 60g3 is filled with a conductive material to form an electrical connection 67b. The electrical connection 67a is electrically connected to one terminal of the coil 65 while the electrical connection 67b is electrically connected to another terminal of the coil 65. The electrical connections 67a and 67b are used to electrically connect the coil 65 with the conductive pads 10p1 and 10p2, respectively, so that induced current generated by the coil 65 can be provided to the electronic components 11a, 11b through the electrical connections 67a, 67b and the interconnection structure (e.g., the RDL) within the substrate 10.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic module, comprising:
   a substrate;
   an electronic component on the substrate;
   a first package body on the substrate and covering the electronic component;
   a magnetic layer on the first package body;
   a single spiral inductor coil on the magnetic layer and including a conductive material, a first section and a second section spaced from the first section, wherein the first section and the second section are connected by the conductive material, wherein the single spiral inductor coil comprises a first terminal and a second terminal that are electrically connected to the substrate, and wherein the single spiral inductor coil comprises a plurality of turns, and each turn of the coil comprises a respective portion comprising the conductive material, the portion comprising the conductive material co-aligned with at least one portion comprising the conductive material of an adjacent turn of the plurality of turns; and
   a second package body on the magnetic layer and covering the single spiral inductor coil.

2. The electronic module of claim 1, further comprising a connection element penetrating the first package body, the magnetic layer and the second package body to connect the substrate to the single spiral inductor coil.

3. The electronic module of claim 1, further comprising an adhesive layer between the first package body and the magnetic layer.

4. The electronic module of claim 1, wherein a second filler of the second package body is smaller than a first filler of the first package body.

5. The electronic module of claim 1, wherein
the single spiral inductor coil further includes a third section and a fourth section, the first section spaced from the fourth section and the second section spaced from the third section; and
the first section is connected to the fourth section by the conductive material and the second section is connected to the third section by the conductive material.

6. The electronic module of claim 1, wherein the magnetic layer includes ferric oxide ($Fe_2O_3$), iron-manganese-zinc-oxide (Fe—Mn—Zn—O) or iron-nickel-zinc-oxide (Fe—Ni—Zn—O).

7. The electronic module of claim 1, further comprising an insulating layer on the magnetic layer, wherein an area of the magnetic layer is smaller than an area of the insulating layer.

8. The electronic module of claim 7, wherein the area of the magnetic layer is equal to or greater than about 95% of the area of the insulating layer.

9. The electronic module of claim 1, wherein a thickness of the single spiral inductor coil is greater than or equal to about 10 µm.

10. The electronic module of claim 1, wherein the single spiral inductor coil and the conductive material comprise the same material.

11. The electronic module of claim 1, wherein the single spiral inductor coil and the conductive material comprise different materials.

12. The electronic module of claim 1, wherein the single spiral inductor coil is configured to generate a current in response to a change of a magnetic field and to provide the current to the electronic component.

13. The electronic module of claim 1, wherein an area of the magnetic layer is less than an area of the first package body.

14. The electronic module of claim 1,
further comprising a first conductive pad on the substrate and a second conductive pad on the substrate, and wherein
the first terminal is adjacent to an edge of the single spiral inductor coil and the second terminal is adjacent to a center of the single spiral inductor coil;
the first terminal of the single spiral inductor coil is electrically connected to the first conductive pad on the substrate and under the first terminal; and
the second terminal of the single spiral inductor coil is electrically connected to the second conductive pad on the substrate and under the second terminal.

15. An electronic module, comprising:
a substrate;
an electronic component on the substrate;
a first package body on the substrate and covering the electronic component;
a magnetic layer on the first package body;
a single spiral inductor coil on the magnetic layer, the single spiral inductor coil comprising a first segment, a second segment spaced from the first segment, and a plurality of conductive members including a conductive member connecting the first segment with the second segment, wherein the conductive member connecting the first segment with the second segment is electrically connected to the substrate through the first segment or the second segment, and wherein the single spiral inductor coil comprises a plurality of turns, and each turn of the coil comprises a respective portion comprising one conductive member of the plurality of conductive members, the portion comprising the one conductive member of the plurality of conductive members co-aligned with at least one portion comprising one conductive member of the plurality of conductive members of an adjacent turn of the plurality of turns, and
a second package body on the magnetic layer and covering the single spiral inductor coil.

16. The electronic module of claim 15, wherein the first segment and the second segment are electrically connected through the conductive member connecting the first segment with the second segment.

17. The electronic module of claim 16, wherein the first segment, the second segment and the conductive member connecting the first segment with the second segment comprise a same material.

18. The electronic module of claim 15, further comprising a connection element penetrating the first package body, the magnetic layer and the second package body to connect the substrate to the single spiral inductor coil.

19. The electronic module of claim 15, further comprising an adhesive layer between the first package body and the magnetic layer.

20. The electronic module of claim 15, wherein the first package body comprises a first filler, the second package body comprises a second filler, and the second filler of the second package body is smaller than the first filler of the first package body.

21. The electronic module of claim 1, wherein the conductive material is electrically connected to the substrate through the first section or the second section.

22. The electronic module of claim 1, wherein the first section, the second section spaced from the first section, and the conductive material define a single spiral shape.

* * * * *